US010352725B2

(12) United States Patent
Hallberg (10) Patent No.: US 10,352,725 B2
(45) Date of Patent: Jul. 16, 2019

(54) SENSOR CALIBRATION METHOD AND SYSTEM

(71) Applicant: Sharp Laboratories of America, Inc., Camas, WA (US)

(72) Inventor: Bryan Severt Hallberg, Vancouver, WA (US)

(73) Assignee: Sharp Laboratories of America, Inc., Vancouver, WA (US)

( * ) Notice: Subject to any disclaimer, the term of this patent is extended or adjusted under 35 U.S.C. 154(b) by 1024 days.

(21) Appl. No.: 14/742,852

(22) Filed: Jun. 18, 2015

(65) Prior Publication Data

US 2016/0370203 A1    Dec. 22, 2016

(51) Int. Cl.
| | |
|---|---|
| *G01C 25/00* | (2006.01) |
| *G01C 17/38* | (2006.01) |
| *G01C 19/00* | (2013.01) |
| *G01P 21/00* | (2006.01) |
| *G01R 33/00* | (2006.01) |

(52) U.S. Cl.
CPC .......... *G01C 25/005* (2013.01); *G01C 17/38* (2013.01); *G01C 19/00* (2013.01); *G01P 21/00* (2013.01); *G01R 33/0035* (2013.01)

(58) Field of Classification Search
CPC ...... G01C 25/005; G01C 17/38; G01C 19/00; G01P 21/00; G01R 33/005
See application file for complete search history.

(56) References Cited

U.S. PATENT DOCUMENTS

| | | | |
|---|---|---|---|
| 6,128,585 A * | 10/2000 | Greer ................ | G01B 11/002 356/139.03 |
| 6,968,281 B2 | 11/2005 | Hanse | |
| 8,374,817 B2 | 2/2013 | Boeve et al. | |
| 8,593,341 B2 | 11/2013 | Anand et al. | |
| 8,677,640 B2 | 3/2014 | Mayor et al. | |
| 8,717,009 B2 | 5/2014 | Tu | |
| 8,838,403 B2 | 9/2014 | del Castillo et al. | |
| 8,851,996 B2 | 10/2014 | Russo | |
| 8,922,198 B2 | 12/2014 | Almalki et al. | |

(Continued)

FOREIGN PATENT DOCUMENTS

| | | |
|---|---|---|
| WO | WO 2002/046693 | 6/2002 |
| WO | WO 2013/066891 | 5/2013 |

*Primary Examiner* — Sujoy K Kundu
*Assistant Examiner* — L. Anderson
(74) *Attorney, Agent, or Firm* — ScienBiziP, P.C.

(57) ABSTRACT

A sensor calibration method and system dynamically compute a bias offset which is subtracted from field strength readings generated by a sensor to correct them. The three-dimensional space around a sensor is seeded with orientation targets. As the sensor is rotated to different orientations, field strength readings are generated by the sensor and assigned to different targets based on estimated proximity. Once occupancy of targets conforms to a first state of occupancy, a coarse bias offset is computed for the sensor using readings from occupied targets. Once occupancy of targets conforms to a second state of occupancy, a refined bias offset is computed for the sensor using readings from occupied targets. Multiple sensors may be calibrated concurrently. Moreover, a user interface provides a real-time graphic showing the location and occupancy status of individual targets and highlighting the individual target best aligned with a most recent corrected sensor reading.

18 Claims, 10 Drawing Sheets

(56) References Cited

U.S. PATENT DOCUMENTS

| | | | |
|---|---|---|---|
| 8,952,682 B2 | 2/2015 | Mahan et al. | |
| 8,977,512 B1 | 3/2015 | Cote et al. | |
| 9,674,323 B1* | 6/2017 | Yu | H04M 1/0274 |
| 2002/0100178 A1* | 8/2002 | Smith | G01C 17/38 |
| | | | 33/356 |
| 2013/0320966 A1* | 12/2013 | Oliver | G01R 33/0035 |
| | | | 324/202 |
| 2015/0241390 A1* | 8/2015 | Figaro | G01N 19/00 |
| | | | 702/65 |

* cited by examiner

Example: $\vec{B_D} = 0$

| $\theta$ | $\psi$ | $|B_M/B_E|$ |
|---|---|---|
| 0 | 0 | 1.0 |
| 45 | 45 | 1.0 |
| 90 | 90 | 1.0 |
| 135 | 135 | 1.0 |
| 180 | 180 | 1.0 |
| 225 | 225 | 1.0 |
| 270 | 270 | 1.0 |
| 315 | 315 | 1.0 |

Example: $\vec{B_B} = |\tfrac{3}{4}B_E|\angle 150°$

| θ | ψ | $|B_M/B_E|$ |
|---|---|---|
| 0 | 47 | 0.51 |
| 45 | 87 | 1.08 |
| 90 | 115 | 1.52 |
| 135 | 141 | 1.73 |
| 180 | 167 | 1.69 |
| 225 | 194 | 1.40 |
| 270 | 224 | 0.90 |
| 315 | 280 | 0.34 |

SENSOR CALIBRATION METHOD AND SYSTEM

The present invention relates to calibration of field-based sensors and, more particularly, calibration of sensors used to determine an object's orientation.

Inertial measurement units, also called inertial motion units (IMUs), are devices that facilitate continuous computation of the orientation of the objects to which they are attached. By way of example, IMUs may be attached to human body limbs, robotic appendages or aerial drones. IMUs typically have multiple single- or multi-axis sensors, such as gyroscopes, accelerometers and magnetometers. Ideally, the accelerometer and magnetometer respectively measure the field strength of the local gravitational and magnetic fields produced by a reference object, such as Earth, and in turn produce sensor field strength readings. The gyroscope measures the rotational speed of the sensor relative to itself, producing a sensor rotational speed reading. The sensor field strength and rotational speed readings may be used singularly or in combination to compute the orientation of the IMU and its associated objects relative to the reference object. This object orientation is typically applied in an object motion tracking application.

If IMU sensors are not calibrated properly, they exhibit a measurement bias and report erroneous field strength and rotational speed readings. For example, in an ideal case, a magnetometer measures the Earth's magnetic field. But in an actual use case, a biasing magnetic field in the vicinity of the magnetometer may combine with the Earth's magnetic field and skew the Earth's magnetic field strength readings that the magnetometer would ideally report. If not corrected, the bias in the magnetometer's field strength readings can bias the object orientation output.

Measurement bias can develop even where an IMU sensor is initially calibrated properly. Measurement bias can be caused by internal sensor offsets or environmental effects. An IMU sensor can therefore develop measurement bias over time as the environment changes. As a result, continuous calibration of an IMU sensor is helpful to maintaining integrity over a sustained period of the field strength and rotational speed readings and the object orientation output that such readings generate.

Yet continuous IMU sensor calibration, if performed injudiciously, can severely tax the processing resources of the IMU, leading to problems such as computation latency and premature battery drain. For example, some IMUs rely on least-squares calibration methodologies to estimate a bias offset. These methodologies often require voluminous high-order computations. As a result, IMUs employing these methodologies can either continuously calibrate at risk of computation latency and premature battery drain, or calibrate only on initialization at risk of reduced integrity of object orientation outputs over time.

Other calibration techniques do not tax IMU processing resources as heavily, such as techniques which simply average the current minimum and maximum field strength readings to estimate a bias offset. While these calibration techniques conserve processing resources, their vulnerability to outlier readings and general lack of sophistication leave IMU's employing such techniques highly susceptible to yielding erroneous object orientation outputs.

SUMMARY OF THE INVENTION

The present invention provides a sensor calibration method and system that maintain high integrity field strength readings over time and are computationally efficient. The calibration method and system dynamically compute a bias offset representing the estimated calibration center of a sensor. The bias offset is subtracted from raw field strength readings generated by the sensor to correct them before they are used in a motion tracking application for an object to which the sensor is attached. In embodiments of the invention, the three-dimensional space around a sensor (which may be housed within an IMU) is seeded with orientation targets situated a unit distance from the sensor and separated by a substantially or precisely uniform distance from each other. These orientation targets form a unit sphere surrounding the sensor having a substantially or precisely uniform angular distance between any given target and its immediately neighboring targets. The orientation targets are initially unoccupied. As the sensor (or the IMU in which the sensor is housed) is rotated to different orientations, field strength readings are generated by the sensor and assigned to different orientation targets based on estimated proximity. Once occupancy of targets by single readings conforms to a first state of occupancy, a coarse bias offset is dynamically computed for the sensor using the single readings from the occupied targets. Once occupancy of targets by single readings conforms to a second state of occupancy (which is a higher-occupancy state), multiple readings are allowed to be assigned to the same target and a refined bias offset is dynamically computed for the sensor using the multiple readings from the occupied targets. The current bias offset is used to correct raw field strength readings generated by the sensor before such readings are applied in a motion tracking application for an object to which the sensor is attached. In some embodiments, multiple sensors are calibrated concurrently in the foregoing manner. Moreover, in some embodiments, a user interface provides a real-time graphic showing the location and occupancy status of individual targets and highlighting the individual target best aligned with a most recent corrected field strength reading.

In one aspect of the invention, a sensor calibration method comprises generating a plurality of orientation targets in three-dimensional space around a sensor; generating field strength readings by the sensor when at different orientations; assigning the readings to different ones of the targets based on estimated proximity between the readings and the targets whereby different ones of the targets are occupied by the readings; comparing a current occupancy of targets by readings for conformance with a predetermined state of target occupancy; and computing a bias offset for the sensor when the current occupancy conforms with the predetermined state of target occupancy.

In some embodiments, the targets are grouped in a plurality of zones and conformance of the current occupancy with the predetermined state of target occupancy is determined based on occupancy of the zones by readings.

In some embodiments, the targets are paired with diametrically opposing targets and conformance of the current occupancy with the predetermined state of target occupancy is determined based on occupancy of the paired targets by readings.

In some embodiments, the bias offset is computed as an average of minimum and maximum readings for each of three spatial dimensions among readings from occupied targets.

In some embodiments, the bias offset is computed as an average of readings for each of three spatial dimensions among readings from only diametrically opposed occupied targets.

In some embodiments, the bias offset is computed using readings from targets occupied by single readings.

In some embodiments, the bias offset is computed using readings from targets occupied by multiple readings.

In some embodiments, the bias offset is computed using filtered readings from targets occupied by multiple readings.

In some embodiments, the assigning step comprises assigning the readings to tentative targets having an estimated shortest distance from the readings in a positive X, Y, Z octant of the three-dimensional space around the sensor and combining the tentative targets with X, Y, Z sign values from the readings to identify the assigned targets in a final octant of the three-dimensional space around the sensor.

In some embodiments, the computing step comprises computing a coarse bias offset for the sensor when the current occupancy conforms with a first predetermined state of target occupancy and computing a refined bias offset for the sensor when the current occupancy conforms with a second predetermined state of target occupancy.

In some embodiments, the bias offset is used to correct a field strength reading taken by the sensor.

In some embodiments, the bias offset is used to correct a field strength reading taken by the sensor by subtracting the bias offset from the taken reading.

In some embodiments, magnitudes of the readings are normalized to an orientation target unit sphere radius before estimating distances to targets in the assigning step.

In some embodiments, the method concurrently calibrates a plurality of sensors.

In some embodiments, the method further comprises displaying on a user interface a graphic showing locations and occupancy status of individual ones of the targets.

In some embodiments, the method further comprises displaying on a user interface a graphic showing locations of individual ones of the targets and highlighting one of the individual targets best aligned with a most recent corrected field strength reading taken by the sensor.

In some embodiments, the method further comprises buffering the readings and reassigning at least one of the buffered readings to a different one of the targets based on an updated estimated proximity between the buffered reading and the different target determined using the computed bias offset.

In some embodiments, the sensor is a magnetometer.

In some embodiments, the sensor is an accelerometer.

In some embodiments, the sensor resides on an IMU.

In another aspect of the invention, a sensor calibration system comprises a sensor configured to measure a physical property at different orientations of the sensor and generate field strength readings for the sensor based on measurements of the physical property; and a processor communicatively coupled with the sensor, wherein under control of the processor the system is configured to generate a plurality of orientation targets in three-dimensional space around the sensor, assign the readings to different ones of the targets based on estimated proximity between the readings and the targets whereby different ones of the targets are occupied by the readings, compare a current occupancy of targets by readings with a predetermined state of target occupancy and compute a bias offset for the sensor when the current occupancy of targets by readings conforms with the predetermined state of target occupancy.

In some embodiments, the system further comprises a user interface communicatively coupled with the processor and configured to display based on status information provided by the processor a graphic showing locations and occupancy status of individual ones of the targets and highlighting one of the individual targets best aligned with a most recent corrected field strength reading taken by the sensor.

These and other aspects of the invention will be better understood by reference to the following detailed description taken in conjunction with the drawings that are briefly described below. Of course, the invention is defined by the appended claims.

DETAILED DESCRIPTION OF A PREFERRED EMBODIMENT

Figure 1:
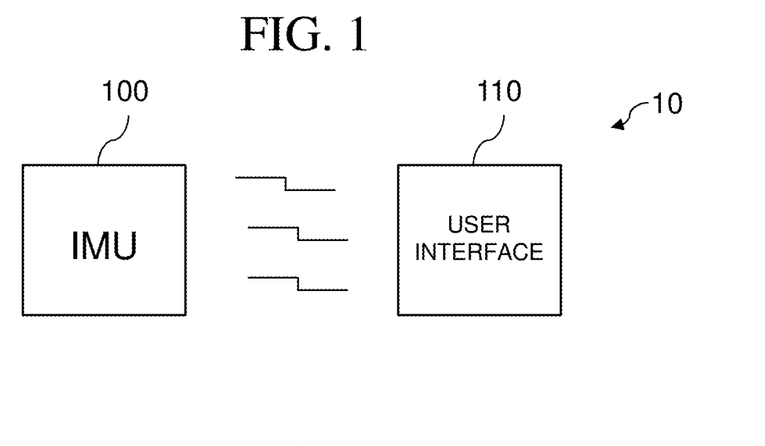
FIG. 1 shows a sensor calibration system in embodiments of the invention.

FIG. 1 shows a sensor calibration system 10 in embodiments of the invention. System 10 includes an IMU 100 communicatively coupled with a user interface 110. Communicative coupling between IMU 100 and user interface 110 may be realized using a wired connection, such as an Ethernet connection, or a wireless connection, such as a Wi-Fi or Bluetooth link. In other embodiments, user interface 110 may be integral with IMU 100.

Within sensor calibration system 10, a sensor calibration method is performed. In embodiments of the invention, the three-dimensional space around IMU 100 is seeded with orientation targets that are separated by a substantially or precisely uniform distance. As IMU 100 is rotated to different orientations, field strength readings are generated by a sensor housed within IMU 100 based on physical properties measured by the sensor. The field strength readings are assigned to different ones of the orientation targets based on estimated proximity between the readings and the targets whereby the targets become occupied by readings. Once occupancy of targets by readings from the sensor conforms with a predetermined state of target occupancy, a bias offset for the sensor is computed using the readings from the occupied targets. The bias offset is used to correct readings generated by the sensor before such readings are applied in a motion tracking application for an object to which IMU 100 is attached. Different methodologies are used to compute the bias offset depending on the current occupancy of the targets by readings. Moreover, system 10 can concurrently calibrate multiple sensors housed within IMU 100 using the sensor calibration method.

Sensor calibration is performed automatically and continuously as IMU 100 undergoes rotation during normal operation. Sensor calibration can also be performed manually by a user of system 10. To facilitate manual sensor calibration, user interface 110 receives calibration status updates from IMU 100, then using that status information renders and outputs on a display a real-time graphic of system 10 showing the locations and state of occupancy of targets and also highlighting the target best aligned with a most recent corrected reading in the sensor's current orientation. This real-time display guides the user through the manual sensor calibration process by instructing the user how to rotate the sensor to finish calibration with minimal work.

Figure 2:
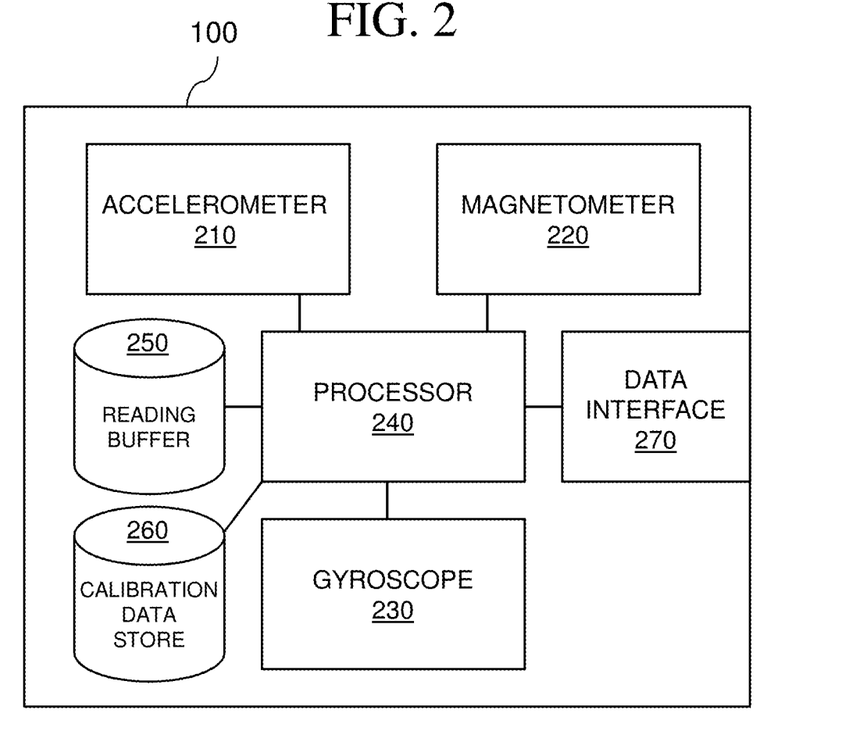
FIG. 2 shows an IMU operative with a sensor calibration system in embodiments of the invention.

FIG. 2 shows IMU 100 in embodiments of the invention. IMU 100 has a plurality of sensors including an accelerometer 210, a magnetometer 220 and a gyroscope 230, all of which are communicatively coupled with a processor 240. These sensors are configured to measure different physical properties in three orthogonal directions. The accelerometer and magnetometer readings ideally represent the three-dimensional field strength readings (i.e., X, Y, Z coordinate readings) of their respective sensors relative to Earth. The sensors feed these readings to processor 240. Processor 240, through execution of software instructions or using a combination of software and custom logic, corrects the readings received from at least one of accelerometer 210 and magnetometer 220 by removing measurement bias and combines the readings from these sensors to compute the orientation of an object with which IMU 100 is associated. The object's orientation is then outputted to an object tracking application, such as a human, robot or drone motion tracking application.

In embodiments of the invention, accelerometer 210 measures three-dimensional acceleration from which the direction of gravity (i.e., down) can be determined. Magnetometer 220 measures three-dimensional magnetic field strength which enables magnetic north to be determined when down is already known. Gyroscope 230 measures three-dimensional angular rotation speed. Raw sensor field strength and rotational speed readings are provided to processor 240, which removes measurement bias from the readings provided by at least one of accelerometer 210 and magnetometer 220 and then combines the readings to compute an orientation of an object to which IMU 100 is attached or with which IMU is otherwise associated. For example, the gyroscopic rotational speed reading may be used to compute a baseline estimate of the object's orientation based upon a previous known orientation, and processor 240 may use the corrected accelerometer and magnetometer field strength readings to make appropriate adjustments to the baseline gyroscopically computed object orientation output to achieve a final estimate of the object's orientation.

In addition to sensors and processor 240, IMU 100 has a reading buffer 250, a calibration data store 260 and a data interface 270 which are communicatively coupled with processor 240. Reading buffer 250 stores field strength readings generated by sensors undergoing calibration so that readings that are assigned to orientation targets can be reassigned to different targets as the bias offset changes. Calibration data store 260 stores current associations between field strength readings and orientation targets. Data interface 270 transmits to user interface 110 calibration status information generated by processor 240 that facilitate manual sensor calibration.

Figure 3:
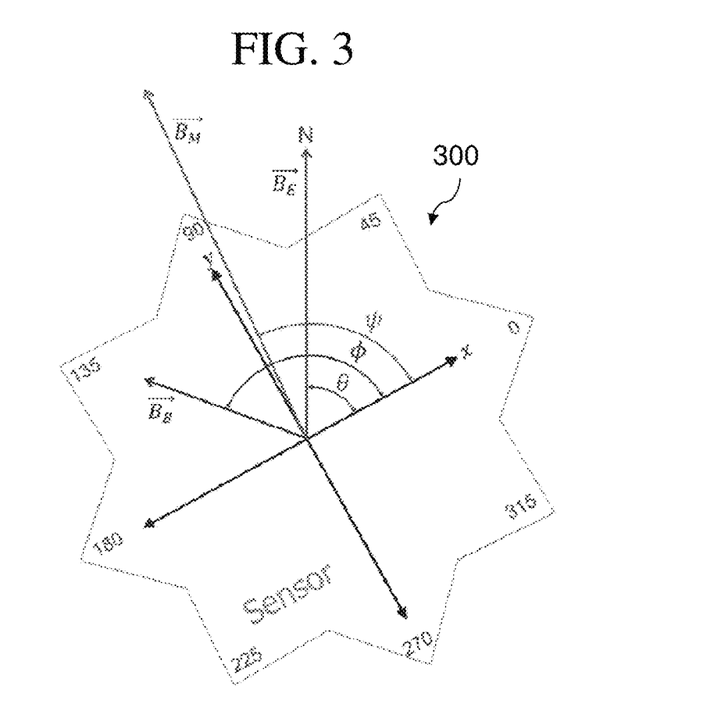
FIG. 3 shows an exemplary magnetometer exhibiting measurement bias.

Removing measurement bias from field strength readings generated by sensors in IMU 100 involves dynamically computing bias offsets for the sensors and subtracting these bias offsets from the measured readings generated by the sensors to produce corrected readings. For example, FIG. 3 shows an exemplary magnetometer 300 which exhibits measurement bias. Magnetometer 300 should ideally provide a field strength reading ($\vec{B}_E$) that measures the Earth's magnetic field, which is at an angle θ relative to the zero angle of magnetometer 300. However, the actual field strength reading provided by magnetometer 300 is influenced by a bias offset ($\vec{B}_B$) from a biasing magnetic field, which is at an angle φ relative to the zero angle of magnetometer 300, and which combines with the Earth's magnetic field to cause the actual field strength reading ($\vec{B}_M$) to measure a bias-influenced field which is at an angle ψ relative to the zero angle of magnetometer 300. In embodiments of the invention, the measurement bias that skews the actual field strength reading is removed by estimating the bias offset ($\vec{B}_B$), which represents the calibration center of the sensor, and subtracting it from the actual field strength reading ($\vec{B}_M$) to resolve a corrected reading that approximates the ideal field strength reading ($\vec{B}_E$).

Figure 4A:
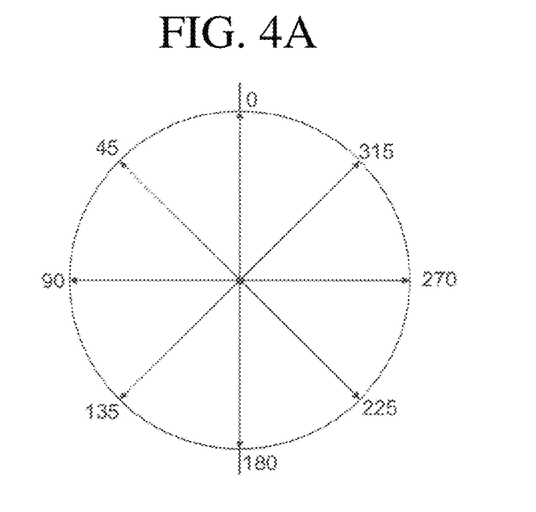
FIGS. 4A and 4B show an ideal case of a magnetometer that does not exhibit measurement bias.
Figure 4B:
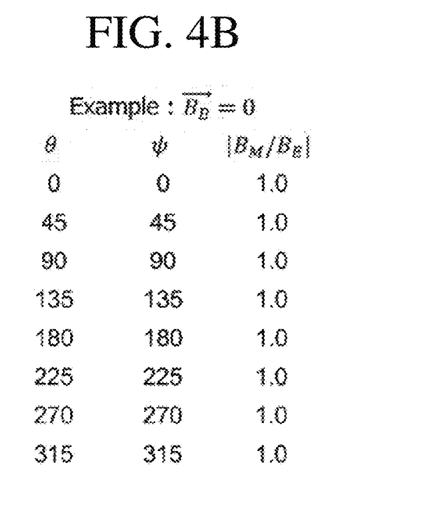
Figure 5A:
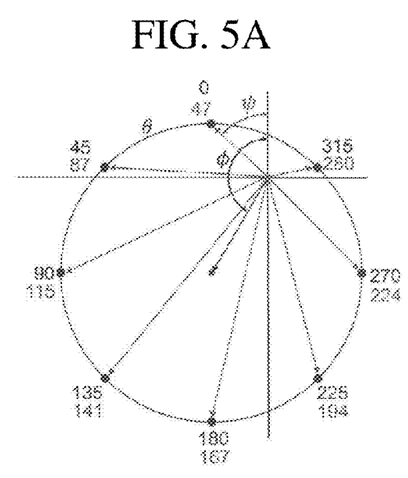
FIGS. 5A and 5B show an actual use case of a magnetometer that exhibits measurement bias.
Figure 5B:
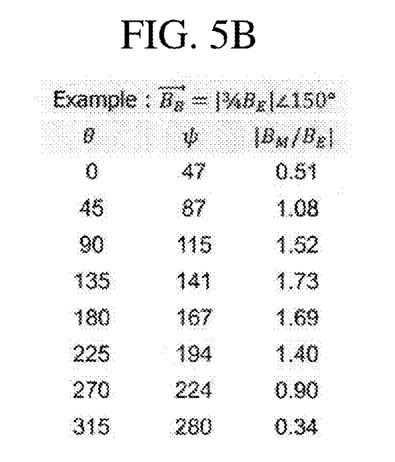

Taking concrete examples, FIGS. 4A and 4B show the orientation of the magnetic fields being measured relative to the zero angle of an ideal magnetometer that does not exhibit measurement bias as the magnetometer is rotated clockwise through 360 degrees. Since there is no biasing magnetic field, there is no bias offset ($\vec{B}_B$=0) and the actual orientation of the measured magnetic field ($\vec{B}_M$) is aligned (angle ψ) with the Earth's magnetic field ($\vec{B}_E$) for every angle θ that the magnetometer is rotated relative to the Earth's magnetic field. On the other hand, FIGS. 5A and 5B show the orientation of the magnetic fields being measured relative to the zero angle of a non-ideal magnetometer that exhibits measurement bias. In this case, there is a biasing magnetic field that is ¾ the strength of the Earth's magnetic field and is oriented at a 150-degree offset from the zero angle of the magnetometer. As the magnetometer is rotated, the influence of the biasing magnetic field changes such that when the magnetometer is oriented at zero degrees (θ=0) relative to Earth's magnetic field, the magnetic field being measured is aligned 47 degrees from the zero angle of the magnetometer and has a field strength that is 51% of the Earth's magnetic field; whereas when the magnetometer is oriented at 45 degrees (θ=45) relative to Earth's magnetic field, the magnetic field being measured is aligned 87 degrees from the zero angle of the magnetometer and has a field strength that is 108% of the Earth's magnetic field; and so on. The diagram and table of FIGS. 5A and 5B show the influence of the biasing magnetic field on the alignment of the magnetic field being measured by the magnetometer at various rotations of the magnetometer relative to Earth's magnetic field. In embodiments of the invention, measurement biases are removed by estimating the bias offset ($\vec{B_B}$) representing the calibration center of the sensor and subtracting it from the actual field strength reading ($\vec{B_M}$) to obtain a corrected reading that is close to the ideal field strength reading ($\vec{B_E}$).

Figure 6:
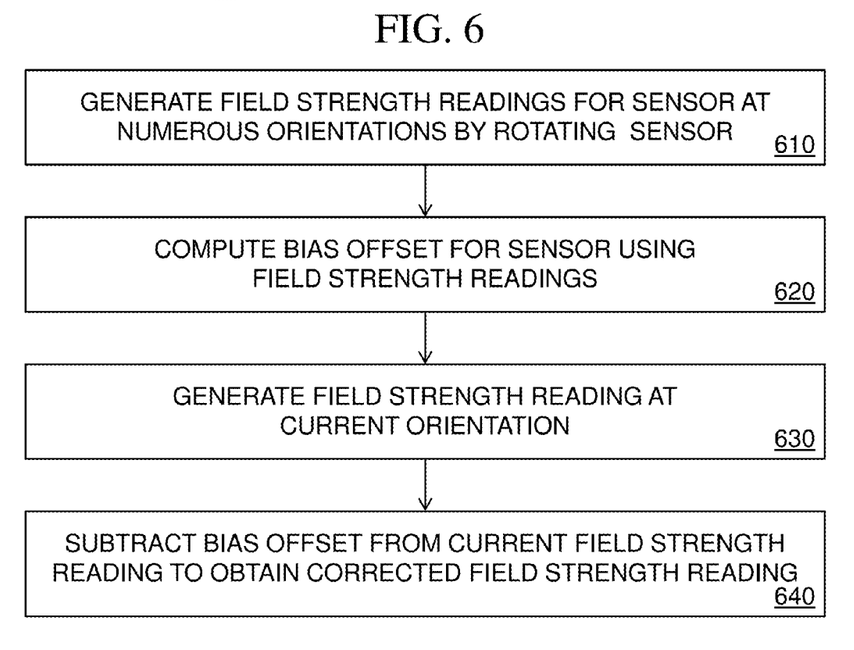
FIG. 6 shows a sensor calibration method in embodiments of the invention.

FIG. 6 shows a sensor calibration method at a high level in embodiments of the invention. At the outset, a sensor housed within IMU 100, such as accelerometer 210 or magnetometer 220, generates field strength readings at numerous orientations to which the sensor (or IMU 100) is rotated (610). Processor 240 then computes a bias offset for the sensor using the numerous field strength readings (620). The sensor then generates a field strength reading at a current orientation of the sensor (630) and processor 240 subtracts the bias offset from the current field strength reading to obtain a corrected field strength reading for the sensor (640). The corrected field strength reading for the sensor is then used, alone or in combination with readings for other sensors, to compute an orientation output for an object to which the sensor is attached. In embodiments of the invention, this method is performed continuously in the background of a motion tracking application as each new field strength reading arrives from accelerometer 210 or magnetometer 220 to provide continuous calibration of accelerometer 210 or magnetometer 220, or both concurrently. Moreover, this method can also be performed by a user of the motion tracking application to manually calibrate accelerometer 210 or magnetometer 220, or both concurrently.

In embodiments of the invention, the sensor calibration method has greater complexity than the method shown in FIG. 6. For example, in some embodiments, processor 240 generates orientation targets in three-dimensional space around a sensor; the sensor then generates field strength readings when at different orientations; processor 240 then assigns the readings to different ones of the targets based on estimated proximity between the readings and the targets; processor 240 then compares a current occupancy of targets by readings with a predetermined state of target occupancy; and processor 240 then computes a bias offset for the sensor when the current occupancy conforms with the predetermined state of target occupancy. Furthermore, in some embodiments, the method operates in three distinct stages that are transitioned between as the current occupancy of targets by readings changes: A major zone populating stage, a minor zone populating stage and a pair averaging stage.

Figure 7:
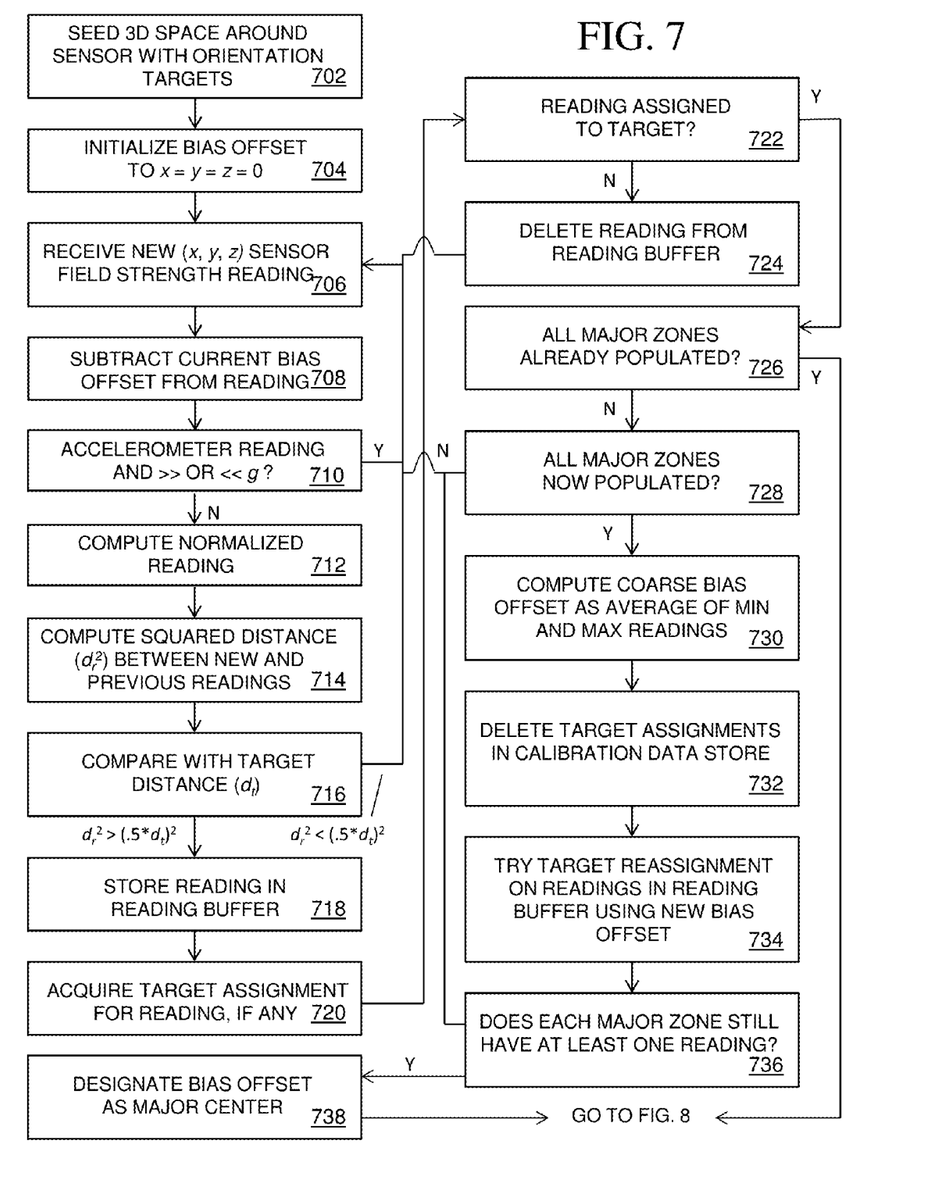
FIG. 7 shows a major zone populating stage of a sensor calibration method in embodiments of the invention.

FIG. 7 shows a major zone populating stage of a sensor calibration method in embodiments of the invention. This stage is performed when the current occupancy of orientation targets by field strength readings is non-conformant with a first predetermined state of target occupancy that requires minimal population of all defined major zones. In preparation for this stage, processor 240 seeds the three-dimensional space around a sensor to be calibrated, such as accelerometer 210 or magnetometer 220 housed within IMU 100, with orientation targets (702). The orientation targets are situated equidistant from the sensor on a unit target sphere, are separated by a substantially or precisely uniform distance and are initially unoccupied by field strength readings. This seeding of the three-dimensional space around a sensor with orientation targets is illustrated in FIGS. 11-14, where a unit target sphere 1100 is shown seeded with 146 orientation targets 1110 that are substantially uniformly spaced at 13 different latitudes and 24 different longitudes. In other embodiments, there may be different numbers of seeded orientation targets, latitudes and/or longitudes.

Next, the bias offset ($\vec{B_B}$) is initialized to x=y=z=0, that is, to the origin point (0, 0, 0) (704). This reflects an initial assumption that the sensor is ideal and does not exhibit any measurement bias.

Next, processor 240 receives a new field strength reading ($\vec{B_M}$=(x, y, z)) from the sensor (706).

Next, processor 240 subtracts the current bias offset ($\vec{B_B}$) from the reading (708) to obtain a more centered reading. Initially, the bias offset is (0, 0, 0) but changes over time as described herein.

Next, if the sensor that generated the reading is an accelerometer (e.g., accelerometer 210), the squared magnitude of the more centered acceleration reading is calculated and compared with $g^2$, or the square of one times the acceleration of gravity (710). If the square of the more centered reading is much different than $g^2$, the current field strength reading is too likely to reflect the sensor's inertial motion rather than the direction of gravity and is discarded, whereupon the flow returns to Step 706. If, on the other hand, the square of the more centered reading is sufficiently close to $g^2$ (i.e., within a predetermined range of $g^2$, for example within $1/16^{th}$ of $g^2$, the current field strength reading continues to be processed. The difference between the square of the more centered reading and $g^2$ is computed by taking the absolute value of the sum the squares of each reading coordinate minus $g^2$, then dividing by $g^2$, as follows:

$$\Delta f^2 = \frac{|x^2 + y^2 + z^2 - g^2|}{g^2}$$

If the current field strength reading continues to be processed, processor 240 normalizes the more centered reading to the unit target sphere (712) using the following equation shown in compact and expanded forms, where the X, Y, and Z axes are represented by the orthonormal vectors $\hat{i}$, $\hat{j}$, and $\hat{k}$, respectively:

$$\vec{B_N} = \frac{(\vec{B_M} - \vec{B_B})}{\|(\vec{B_M} - \vec{B_B})\|}$$

$$\vec{B_N} = \frac{\hat{i}(B_{M,x} - B_{B,x}) + \hat{j}(B_{M,y} - B_{B,y}) + \hat{k}(B_{M,z} - B_{B,z})}{\sqrt{(B_{M,x} - B_{B,x})^2 + (B_{M,y} - B_{B,y})^2 + (B_{M,z} - B_{B,z})^2}}$$

Next, processor 240 computes the squared distance ($d_r^2$) between the current normalized reading and the last normalized reading from the sensor that was assigned to an orientation target on the unit target sphere (714). The squared distance is computed by summing the squares of each coordinate difference, as follows:

$$d_r^2 = (\Delta x)^2 + (\Delta y)^2 + (\Delta z)^2$$

Next, processor 240 compares the squared distance ($d_r^2$) with the square of the distance ($d_t$) between orientation targets on the unit target sphere (716). For example, for a unit target sphere with 24 orientation targets on any great circle, the distance between orientation targets is computed according to the following formula:

$$d_t = 2\pi/24$$

Processor 240 next takes a conditional branch depending on the outcome of the comparison at Step 716. If the squared distance ($d_r^2$) is less than the square of half of the distance ($\frac{1}{2}d_t$)$^2$ between orientation targets, the current field strength reading is too close to the last reading assigned to an orientation target and is discarded, whereupon the flow returns to Step 706 and the next field strength reading is processed. If, on the other hand, the squared distance is greater than the square of half of the distance between orientation targets, the current field strength reading is far enough away from the last reading assigned to a target and continues to be processed.

If the current field strength reading continues to be processed, processor 240 stores the reading in reading buffer 250 (718). Buffering of field strength readings in reading buffer 250 allows them to be reassigned to different orientation targets after initial assignment to account for changes over time in the computed bias offset ($\vec{B}_B$).

Figure 10:
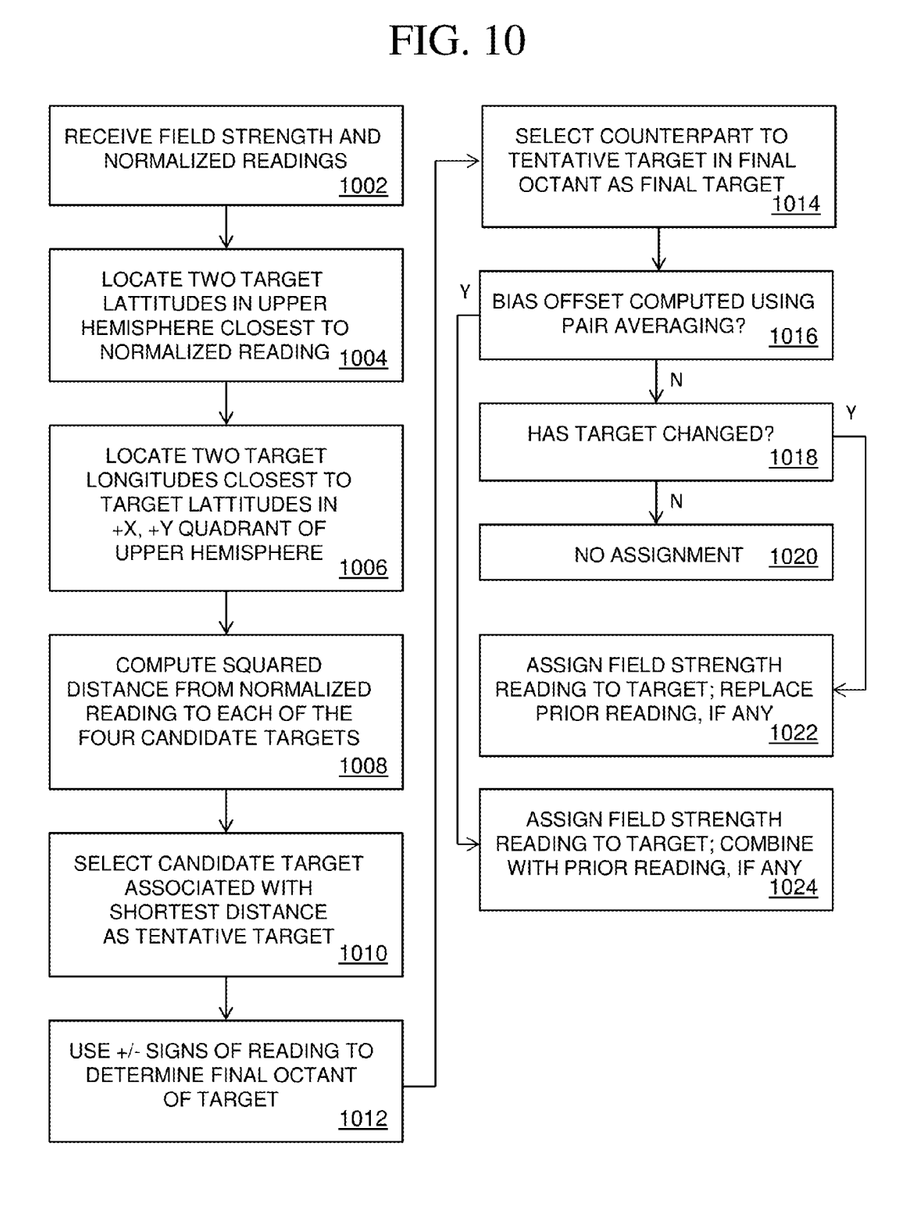
FIG. 10 shows target assignment within a sensor calibration method in embodiments of the invention.

Next, a target assignment routine executed by processor 240 attempts an initial assignment of the current field strength reading to an orientation target on the unit target sphere (720). The target assignment routine is illustrated in FIG. 10 in embodiments of the invention. Depending on the outcome of target assignment, a conditional branch is followed based on whether the routine resulted in the current field strength reading being assigned to an orientation target or not (722). If the reading was not assigned to a target, the reading is discarded and removed from reading buffer 250 (724) whereupon the flow returns to Step 706. If, on the other hand, the reading was assigned to a target, a series of zone population checks ensue to determine whether a new bias offset ($\vec{B}_B$) must be computed and, if so, the computation methodology to be used to compute the bias offset.

Figure 11:
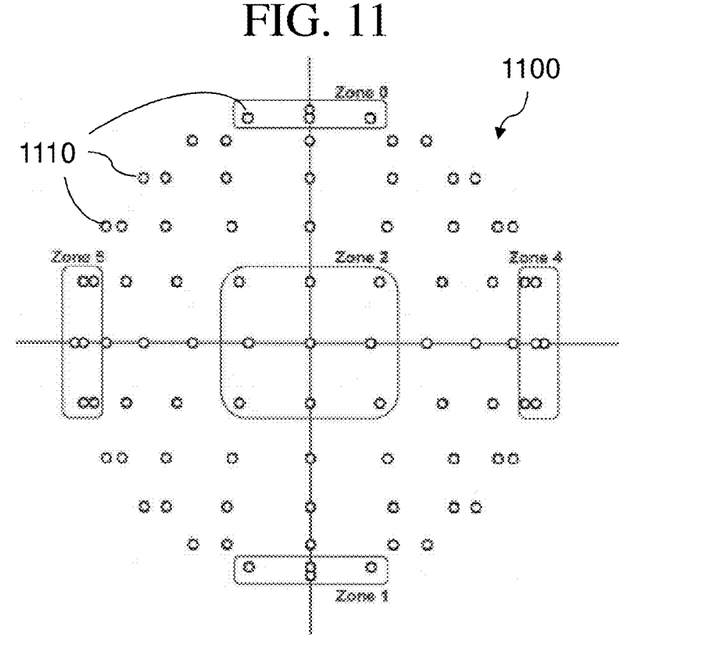
FIG. 11 is a front view of a target-seeded three-dimensional space around a sensor showing major zones in embodiments of the invention.
Figure 12:
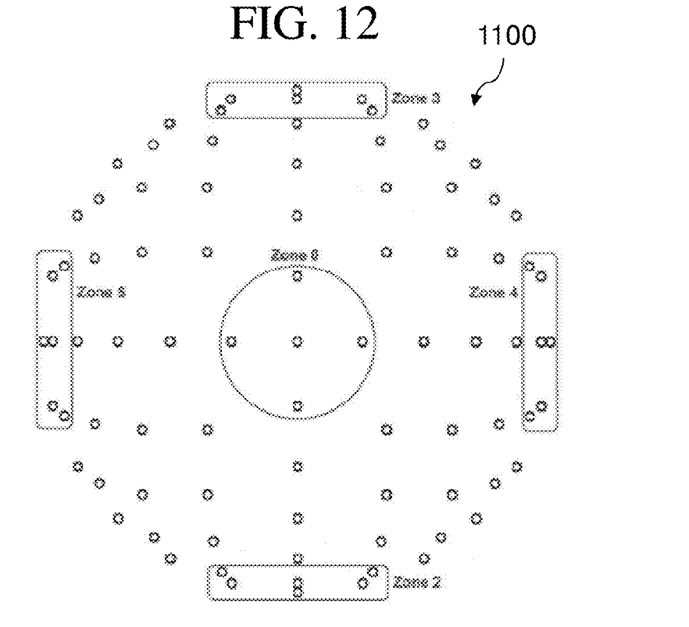
FIG. 12 is a top view of a target-seeded three-dimensional space around a sensor showing major zones in embodiments of the invention.
Figure 13:
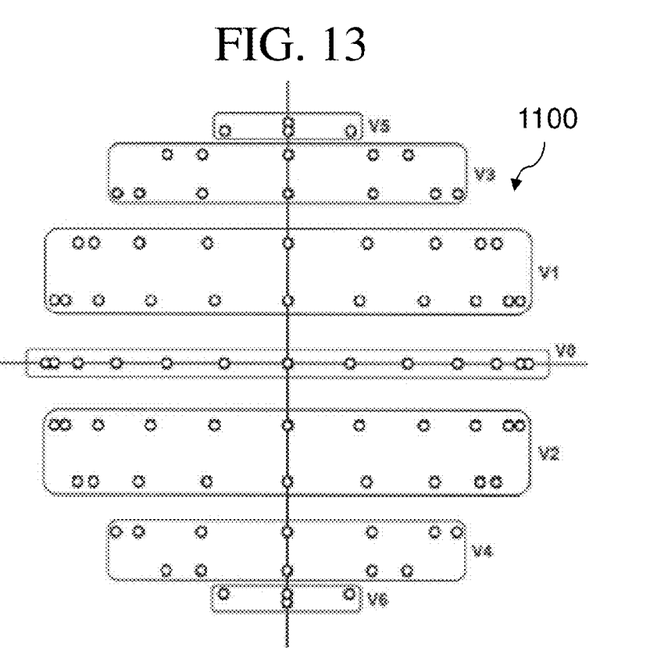
FIG. 13 is a front view of a target-seeded three-dimensional space around a sensor showing minor zones in embodiments of the invention.
Figure 14:
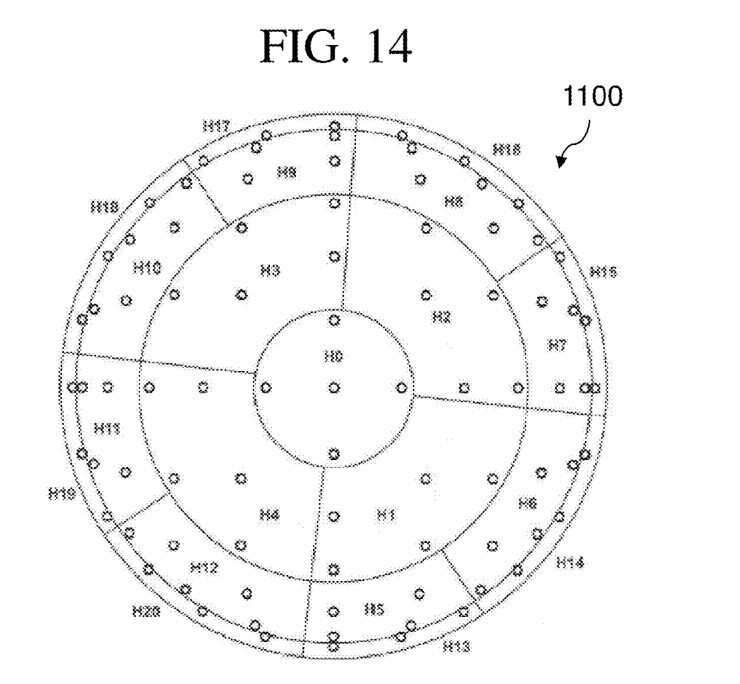
FIG. 14 is a top view of a target-seeded three-dimensional space around a sensor showing minor zones in embodiments of the invention.

The zones applied in zone population checks are illustrated in FIGS. 11-14. Unit target sphere 1100 is subdivided into numerous major and minor zones. FIGS. 11 and 12 show unit target sphere 1100 as having six defined major zones (0-5) each having numerous orientation targets. Minimal population of all major zones by field strength readings is important to reasonably accurate computation of the bias offset. Accordingly, a first predetermined state of target occupancy with which conformance must exist before a coarse bias offset is computed (different than the initial bias offset of zero) requires that at least one target within each major zone be occupied by a reading. FIGS. 13 and 14 show unit target sphere 1100 as further having seven defined minor vertical zones (V0-V6) and 21 defined minor horizontal zones (H0-H20) which intersect and form 17 diametrically opposing minor zone pairs, as follows: V0H13-V0H17, V0H14-V0H18, V0H15-V0H19, V0H16-V0H20, V1H5-V2H9, V1H6-V2H10, V1H7-V2H11, V1H8-V2H12, V1H9-V2H5, V1H10-V2H6, V1H11-V2H7, V1H12-V2H8, V3H1-V4H3, V3H2-V4H4, V3H3-V4H1, V3H4-V4H2 and V5H0-V6H0. A second predetermined state of target occupancy with which conformance must exist before transitioning from the coarse bias offset calculation methodology (which averages minimum-maximum readings of all occupied targets) to a refined bias offset calculation methodology (which performs pair averaging as described herein) requires minimal population of minor zone pairs, that is, each diametrically opposing minor zone pair must have at least one pair of diametrically opposing targets occupied by readings.

Returning to FIG. 7, if the current field strength reading is assigned to an orientation target at Step 722, processor 240 checks whether all major zones were already minimally populated (i.e., each major zone had at least one target with a reading) prior to this assignment (726). If so, the major zone populating stage is complete and the flow advances to the minor zone populating stage shown in FIG. 8.

If all major zones were not already minimally populated, processor 240 checks whether all major zones are now minimally populated as a result of the new assignment (728). If not, the major zone populating stage is still not complete and the flow returns to Step 706 since there is non-conformance with the predetermined state of occupancy required for coarse bias offset computation, namely, minimal population of major zones.

If all major zones are now minimally populated as a result of the new assignment, processor 240 computes a coarse bias offset ($\vec{B}_B$) as the average of minimum and maximum readings for each of three spatial dimensions among readings from all occupied targets (730). The coarse bias estimate is computed using the formula $$\vec{B}_B = \frac{1}{2}(x_{max} + x_{min}, y_{max} + y_{min}, z_{max} + z_{min})$$

where $x_{max}$, $y_{max}$, and $z_{max}$ and $x_{min}$, $y_{min}$ and $z_{min}$ are the maximum and minimum readings in the X, Y and Z directions, respectively, among all occupied targets.

Moreover, if the sensor calibration method is concurrently calibrating both an accelerometer (e.g., accelerometer 210) and a magnetometer (e.g., magnetometer 220), and the accelerometer generated the current field strength reading, a coarse bias offset for the magnetometer is similarly computed using magnetometer field strength readings from all occupied targets even if all major zones are not yet minimally populated with readings from the magnetometer. Notably, the course bias offsets for the accelerometer and magnetometer are independently computed using their respective field strength readings.

Next, processor 240 removes all target assignments from calibration data store 260 (732). In this regard, calibration data store 260 stores entries associating field strength readings and orientation targets reflecting assignments made using a previous bias offset. Once the new bias offset is computed, these associations are potentially suspect and are deleted from memory.

Next, the target assignment routine of FIG. 10 is re-executed by processor 240 to reassign all previously assigned field strength readings to new orientation targets (734). In this regard, all field strength readings currently assigned to orientation targets are stored in reading buffer 250. Once a new bias offset is computed, these readings are retrieved and the target assignment routine of FIG. 10 is invoked to reassign these readings to orientation targets reflecting the new bias offset. Reassignment may be performed in a single instance, a fixed number of instances or until the bias offset remains unchanged in two consecutive instances. For each reading, the final result may be assignment to the same target or a different target than the target to which the reading was previously assigned.

Next, processor 240 checks whether, after target reassignment, each major zone is still minimally populated (i.e., each major zone still has at least one target with a reading) (736).

If not, the new bias offset is insufficiently reliable and the bias offset is restored to the major center (as designated in Step 738 in an earlier iteration of the method) or to zero if there is no major center, whereupon the flow returns to Step 706.

If each major zone is still minimally populated after target reassignment, the new bias offset is retained. Processor 240 designates the new bias offset as the new major center (738) and proceeds to FIG. 8.

Figure 8:
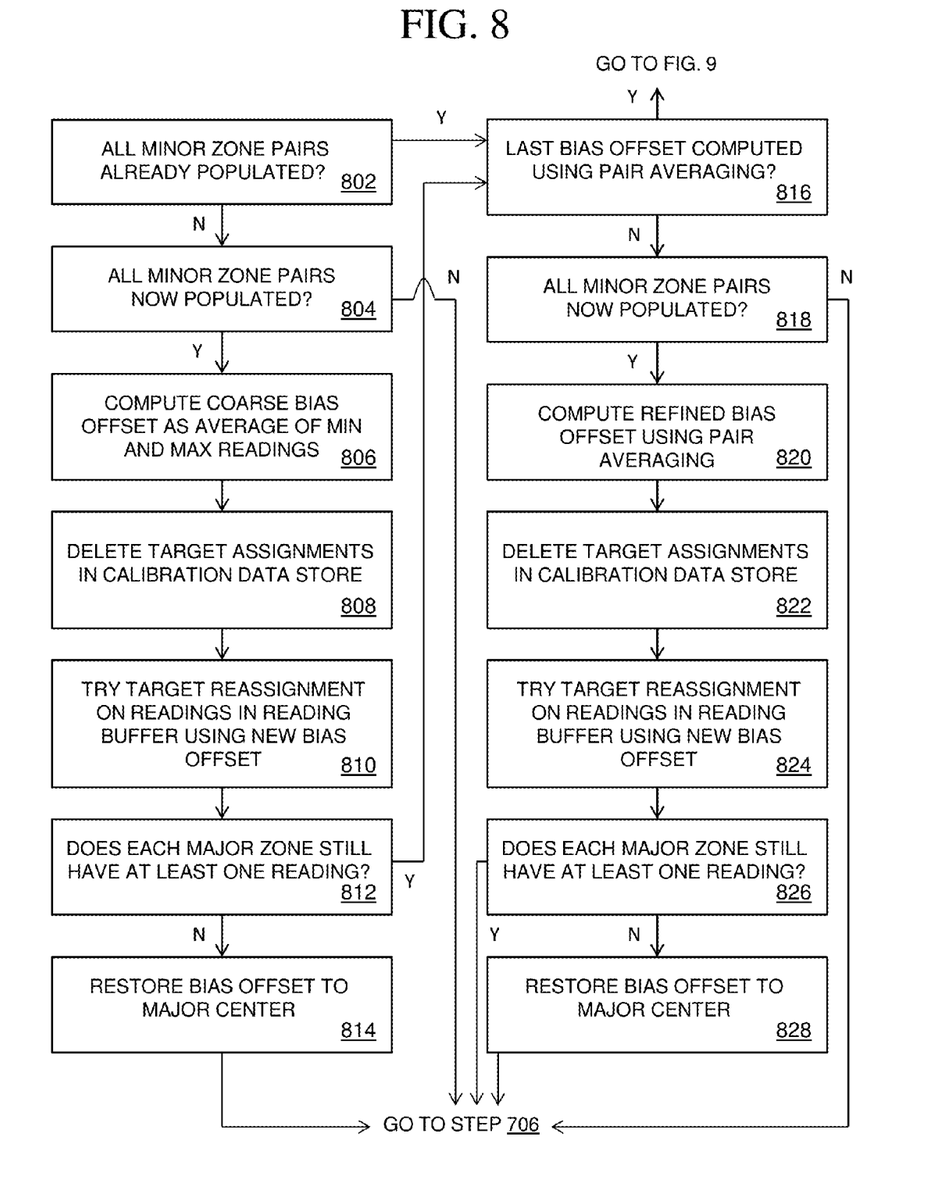
FIG. 8 shows a minor zone populating stage of a sensor calibration method in embodiments of the invention.

FIG. 8 shows a minor zone populating stage of a sensor calibration method in embodiments of the invention. This stage is performed when the current occupancy of targets by readings conforms with the first predetermined state of target occupancy requiring minimal population of major zones, but does not yet conform with the second predetermined state of target occupancy requiring minimal population of minor zone pairs.

Figure 9:
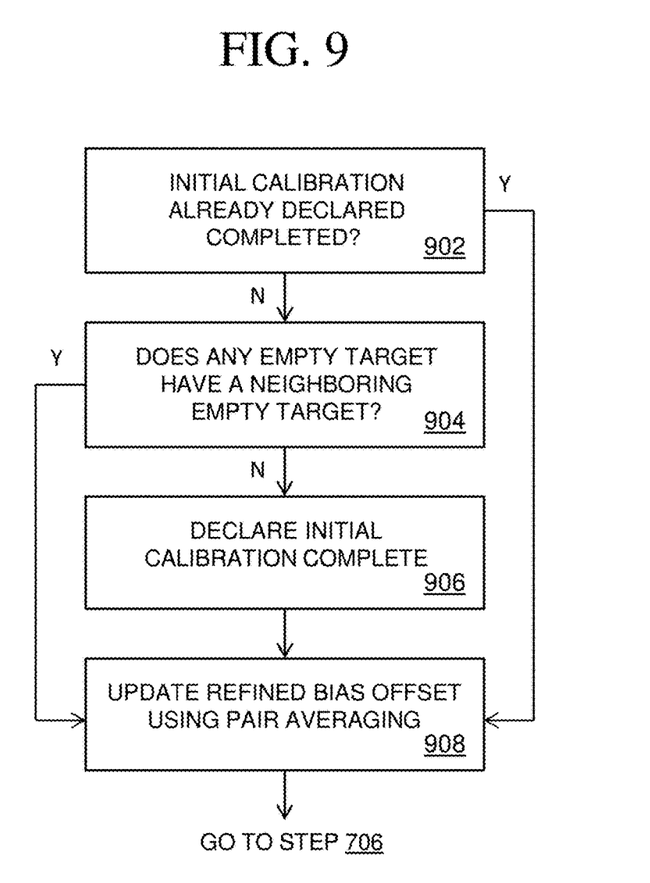
FIG. 9 shows a pair averaging stage of a sensor calibration method in embodiments of the invention.

At the outset of the minor zone populating stage, processor 240 determines whether all minor zone pairs were already minimally populated (i.e., each diametrically opposing minor zone pair had at least one pair of diametrically opposing targets occupied by readings) prior to the new assignment (802). If so, the minor zone populating stage was already complete and the flow advances to the pair averaging stage shown in FIG. 9 provided the last bias offset was computed using pair averaging.

If all minor zones were not already minimally populated, processor 240 checks whether all minor zones are now minimally populated as a result of the new assignment (804). If not, the minor zone populating stage is still not complete and the flow returns to Step 706 since there is non-conformance with the predetermined state of target occupancy required for refined bias offset computation, namely, minimal population of minor zone pairs.

If all minor zones are now minimally populated as a result of the new assignment, processor 240 computes a coarse bias offset ($\vec{B_B}$) as the average of minimum and maximum readings for each of three spatial dimensions among readings from all occupied targets using the formula set forth in Step 726 (806), then removes all target assignments from calibration data store 260 (808), reassigns previously assigned field strength readings to new orientation targets (810) and checks whether, after target reassignment, each major zone is still minimally populated (812). If each major zone is not still minimally populated after target reassignment, the new bias offset is insufficiently reliable and the bias offset is restored to the major center (814) whereupon the flow returns to Step 706. Otherwise, the new bias offset is retained.

If the check at Step 802 revealed that all minor zone pairs were already populated, or the check at Step 812 revealed that each major zone is still minimally populated after target reassignment, processor 240 next checks whether the last bias offset was computed using pair averaging (816), which is more exacting than the coarse bias offset computation methodology described above and helps reduce calibration jitter. In pair averaging, a refined bias offset is computed using the formula $$\vec{B_B} = \frac{1}{N}\sum_N x, y, z$$

where N is the number of readings summed and x, y, and z are the field strength readings in the X, Y and Z directions, respectively, but where the readings are extracted only from occupied targets which have a diametrically opposing target that is also occupied. Furthermore, the readings used in the refined bias offset computation may be filtered readings from targets to which multiple readings have been assigned. In embodiments of the invention, filtered readings are computed by combining readings assigned to the same target using a low-pass filter.

If the last bias offset was computed using pair averaging, the minor zone populating stage is complete and the flow advances to the pair averaging stage of FIG. 9. If not, processor 240 checks whether all minor zones are now minimally populated (818). If not, the minor zone populating stage is still not complete and the flow returns to Step 706 since there is non-conformance with the predetermined state of target occupancy required for invoking refined bias offset computation, namely minimal population of minor zone pairs.

If all minor zones are now minimally populated, processor 240 computes a refined bias offset ($\vec{B_B}$) using pair averaging (820), removes all target assignments from calibration data store 260 (822), reassigns previously assigned orientation readings to new orientation targets (824) and checks whether, after target reassignment, each major zone is still minimally populated (826). If each major zone is not still minimally populated after target reassignment, the new bias offset is insufficiently reliable and the bias offset is restored to the major center (828). Otherwise, the new bias offset is retained. In either event, the flow returns to Step 706.

FIG. 9 shows a pair averaging stage of a sensor calibration method in embodiments of the invention. This stage is performed when the current occupancy of targets by readings conforms with both the first predetermined state of target occupancy requiring minimal population of major zones and the second predetermined state of target occupancy requiring minimal population of minor zone pairs. At the outset of this stage, processor 240 checks whether initial calibration was already declared completed (902). If so, the bias offset is updated using pair averaging (904). If not, processor 240 checks whether any unoccupied orientation target has a neighboring target that is also unoccupied (904). If so, the bias offset is updated using pair averaging (904). If not, initial calibration is declared complete (906) before updating the bias target using pair averaging (904).

FIG. 10 describes the target assignment routine of the sensor calibration method in embodiments of the invention. The routine executes on processor 240 to achieve initial target assignment as well as target reassignment. At the outset, processor 240 receives both the field strength reading ($\vec{B_M}$) (e.g., from reading buffer 250) and the previously computed normalized reading ($\vec{B_N}$) from Step 712 (1002).

Next, processor 240 identifies the two latitudes among the seeded equatorial and upper hemisphere latitudes on the unit target sphere which are closest to the absolute value of the Z-coordinate of the normalized reading ($\vec{B_N}$) (1004).

Next, for each identified latitude, processor 240 identifies the two longitudes in the positive-X, positive-Y quadrant of the upper hemisphere which are closest to the absolute value of the X-coordinate of the normalized reading ($\vec{B_N}$) (1006).

As a result of the Steps 1004 and 1006, four candidate orientation targets emerge in the unit target sphere's positive-X, -Y, -Z octant at intersections of the identified latitudes and longitudes.

Next, processor 240 computes the squared distance from the normalized reading ($\vec{B_N}$) to each of the candidate orientation targets (1008) and selects the orientation target associated with the shortest distance as a tentative target (1010).

Next, processor 240 consults the signs of the coordinates of the normalized reading ($\vec{B_N}$) to determine the final octant (1012).

Next, processor 240 selects the counterpart to the tentative target in the final octant as the final orientation target (1014).

Next, processor 240 determines whether the current bias offset was computed using pair averaging (1016). If so, the field strength reading ($\vec{B_M}$) is assigned to the final target and is combined with other readings that currently occupy the target, if any, to compute a filtered reading. In embodiments of the invention, a low-pass filter is used to prevent abrupt changes to the previous reading. Processor 240 then adds an entry to calibration data store 260 associating the reading and the target.

If the current bias offset was not computed using pair averaging, processor 240 determines whether the final target is different than the target to which the last reading was assigned (1018). If the final target is the same, the field strength reading ($\vec{B_M}$) is discarded and is removed from reading buffer 250 (1020). If the final target is different, the reading is assigned to the final target and supplants the prior reading which occupied the target, if any (1022). Processor 240 associates the reading and the target in calibration data store 260.

Figure 15:
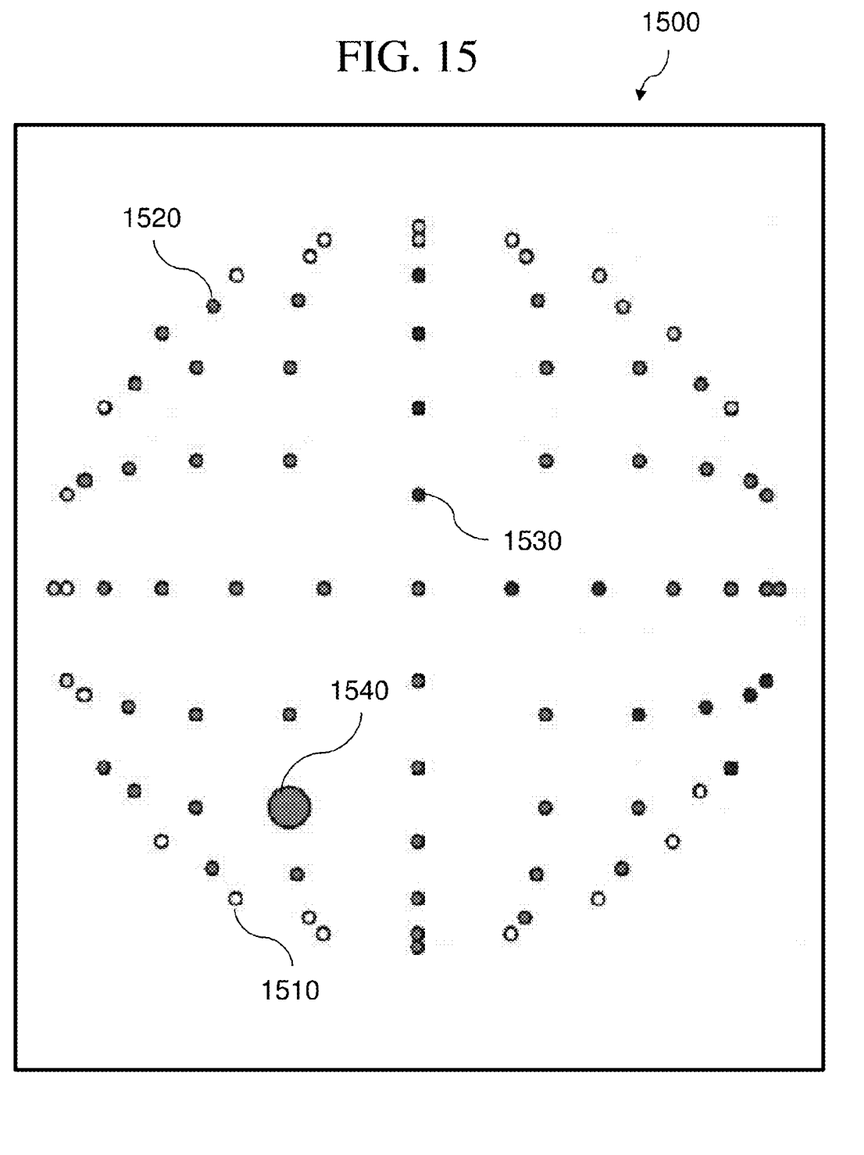
FIG. 15 is a graphic showing the spatial distribution of orientation targets and the current state of occupancy of orientation targets by field strength readings, highlighting the target best aligned with a most recent corrected field strength reading.

FIG. 15 is a graphic 1500 representing the state of system 10. Graphic 1500 is displayed on user interface 110 and is updated in real-time as a user rotates IMU 100 during manual sensor calibration. User interface 110 generates graphic 1500 from calibration status updates received from processor 240 over data interface 270. Graphic 1500 provides a top view of unit target sphere 1100 showing the locations of orientation targets 1510, 1520, 1530, 1540 and the current state of occupancy of orientation targets 1510, 1520, 1530, 1540 by readings, highlighting the target 1540 best (e.g., most closely) aligned with a most recent corrected (e.g., deskewed or unbiased) sensor reading in the sensor's current orientation. Targets 1510, 1520, 1530, 1540 are color-coded or otherwise distinctively filled to convey current occupancy status. For example, unfilled target 1510 is not currently occupied whereas a light target 1520 is currently occupied solely by a magnetometer reading and a dark target 1530 is currently occupied by both a magnetometer reading and an accelerometer reading. Naturally, another distinctive fill type could be used to signify that a target is currently occupied only by an accelerometer reading. User interface 110 generates a similarly detailed bottom view of target unit sphere 1100. These real-time graphics guide the user through the manual sensor calibration process by instructing the user how to rotate the sensor to finish calibration with minimal work.

It will be appreciated by those of ordinary skill in the art that the present invention can be embodied in other specific forms without departing from the spirit or essential character hereof. For example, in embodiments of the invention, the sensor calibration method is invoked to calibrate a field-based sensor other than or in addition to an accelerometer or magnetometer, such as a static electric field sensor. Moreover, in embodiments of the invention, the sensor calibration method is invoked to calibrate sensors that measure a physical property in only two orthogonal directions. The present description is therefore considered in all respects to be illustrative and not restrictive. The scope of the invention is indicated by the appended claims, and all changes that come within the meaning and range of equivalents thereof are intended to be embraced therein.

What is claimed is:

1. A method for calibrating a sensor, the method comprising:
generating a plurality of orientation targets in three-dimensional space around the sensor;
generating field strength readings by the sensor when at different orientations;
assigning the readings to different ones of the targets based on estimated proximity between the readings and the targets whereby different ones of the targets are occupied by the readings, wherein the assigning step comprises assigning the readings to tentative targets having an estimated shortest distance from the readings in a positive X, Y, Z octant of the three-dimensional space around the sensor and combining the tentative targets with X, Y, Z sign values from the readings to identify the assigned targets in a final octant of the three-dimensional space around the sensor;
comparing a current occupancy of targets by readings for conformance with a predetermined state of target occupancy; and
computing a bias offset to correct at least one of the field strength readings generated by the sensor when the current occupancy conforms with the predetermined state of target occupancy.

2. The method of claim 1, wherein the targets are grouped in a plurality of zones and conformance of the current occupancy with the predetermined state of target occupancy is determined based on occupancy of the zones by readings.

3. The method of claim 1, wherein the targets are paired with diametrically opposing targets and conformance of the current occupancy with the predetermined state of target occupancy is determined based on occupancy of the paired targets by readings.

4. The method of claim 1, wherein the bias offset is computed as an average of minimum and maximum readings for each of three spatial dimensions among readings from occupied targets.

5. The method of claim 1, wherein the bias offset is computed as an average of readings for each of three spatial dimensions among readings from only diametrically opposed occupied targets.

6. The method of claim 1, wherein the bias offset is computed using readings from targets occupied by single readings.

7. The method of claim 1, wherein the bias offset is computed using readings from targets occupied by multiple readings.

8. The method of claim 1, wherein the bias offset is computed using filtered readings from targets occupied by multiple readings.

9. The method of claim 1, wherein the bias offset is subtracted from a field strength reading taken by the sensor.

10. The method of claim 1, wherein the method is applied to calibrate a plurality of sensors concurrently.

11. The method of claim 1, further comprising displaying on a user interface a graphic showing locations and occupancy status of individual ones of the targets.

12. The method of claim 1, further comprising displaying on a user interface a graphic showing locations of individual ones of the targets and highlighting one of the individual targets best aligned with a most recent corrected sensor reading.

13. The method of claim 1, wherein the sensor is a magnetometer.

14. The method of claim 1, wherein the sensor is an accelerometer.

15. The method of claim 1, wherein the sensor resides on an inertial measurement unit.

16. A method for calibrating a sensor, the method comprising:

generating a plurality of orientation targets in three-dimensional space around the sensor;

generating field strength readings by the sensor when at different orientations;

assigning the readings to different ones of the targets based on estimated proximity between the readings and the targets whereby different ones of the targets are occupied by the readings;

comparing a current occupancy of targets by readings for conformance with a predetermined state of target occupancy; and computing a bias offset to correct at least one of the field strength readings generated by the sensor when the current occupancy conforms with the predetermined state of target occupancy wherein the computing step comprises computing a coarse bias offset for the sensor when the current occupancy conforms with a first predetermined state of target occupancy and computing a refined bias offset for the sensor when the current occupancy conforms with a second predetermined state of target occupancy.

17. A method for calibrating a sensor, the method comprising:

generating a plurality of orientation targets in three-dimensional space around the sensor;

generating field strength readings by the sensor when at different orientations;

assigning the readings to different ones of the targets based on estimated proximity between the readings and the targets whereby different ones of the targets are occupied by the readings;

comparing a current occupancy of targets by readings for conformance with a predetermined state of target occupancy;

computing a bias offset to correct at least one of the field strength readings generated by the sensor when the current occupancy conforms with the predetermined state of target occupancy, and buffering the readings and reassigning at least one of the buffered readings to a different one of the targets based on an updated estimated proximity between the buffered reading and the different target determined using the computed bias offset.

18. A sensor calibration system, comprising:

a sensor configured to measure a physical property at different orientations of the sensor and generate field strength readings for the sensor based on measurements of the physical property;

a processor communicatively coupled with the sensor, wherein under control of the processor the system is configured to generate a plurality of orientation targets in three-dimensional space around the sensor, assign the readings to different ones of the targets based on estimated proximity between the readings and the targets whereby different ones of the targets are occupied by the readings, compare a current occupancy of targets by readings with a predetermined state of target occupancy and compute a bias offset to correct at least one of the field strength readings generated by the sensor, when the current occupancy of targets by readings conforms with the predetermined state of target occupancy; and buffer the readings and reassign at least one of the buffered readings to a different one of the targets based on an updated estimated proximity between the buffered reading and the different target determined using the computed bias offset.

* * * * *